US012707679B2

(12) United States Patent
Reboh et al.

(10) Patent No.: US 12,707,679 B2
(45) Date of Patent: Aug. 11, 2026

(54) SHIFTED-CHANNEL STACKED FETs

(71) Applicant: INTERNATIONAL BUSINESS MACHINES CORPORATION, Armonk, NY (US)

(72) Inventors: Shay Reboh, Guilderland, NY (US); Ruilong Xie, Niskayuna, NY (US); Julien Frougier, Albany, NY (US); Junli Wang, Slingerlands, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 18/398,789

(22) Filed: Dec. 28, 2023

(65) Prior Publication Data

US 2025/0221029 A1 Jul. 3, 2025

(51) Int. Cl.

| | |
|---|---|
| ***H10D 84/67*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2025.01) |
| ***H10D 84/03*** | (2025.01) |
| ***H10D 84/83*** | (2025.01) |
| ***H10D 84/85*** | (2025.01) |
| ***H10D 88/00*** | (2025.01) |

(52) U.S. Cl.

CPC ....... *H10D 30/6735* (2025.01); *H10D 30/014* (2025.01); *H10D 30/43* (2025.01); *H10D 30/6729* (2025.01); *H10D 62/121* (2025.01); *H10D 62/151* (2025.01); *H10D 84/017* (2025.01); *H10D 84/0186* (2025.01); *H10D 84/038* (2025.01); *H10D 84/832* (2025.01); *H10D 84/85* (2025.01); *H10D 84/856* (2025.01); *H10D 84/859* (2025.01); *H10D 88/01* (2025.01)

(58) Field of Classification Search

None

See application file for complete search history.

(56) References Cited

U.S. PATENT DOCUMENTS

| | | | |
|---|---|---|---|
| 8,274,099 | B2 | 9/2012 | Becker |
| 10,707,218 | B2 | 7/2020 | Paul et al. |
| 10,777,505 | B2 | 9/2020 | Chang et al. |
| 10,811,415 | B2 | 10/2020 | Sengupta et al. |

(Continued)

OTHER PUBLICATIONS

Huang et al., "3-D Self-aligned Stacked NMOS-on-PMOS Nanoribbon Transistors for Continued Moore's Law Scaling", In2020 IEEE International Electron Devices Meeting (IEDM) Dec. 12, 2020, pp. 20-26.

*Primary Examiner* — Feifei Yeung Lopez

(74) *Attorney, Agent, or Firm* — Harrity & Harrity, LLP

(57) ABSTRACT

Semiconductor devices includes a bottom field effect transistor (FET) over a substrate, having a bottom channel and bottom source/drain structures. A bottom plug of dielectric material penetrates the substrate and that makes contact with a channel of the bottom FET. A top FET over the bottom FET has a top channel that is laterally offset with respect to the bottom channel. Electrical contacts reach to the top FET and the bottom FET.

20 Claims, 7 Drawing Sheets

(56) References Cited

U.S. PATENT DOCUMENTS

| | | | |
|---|---|---|---|
| 2020/0075574 | A1 | 3/2020 | Smith et al. |
| 2022/0130822 | A1 | 4/2022 | Chiu et al. |
| 2022/0406715 | A1 | 12/2022 | Xie et al. |
| 2023/0125316 | A1 | 4/2023 | Xie et al. |
| 2023/0178623 | A1 | 6/2023 | Li et al. |
| 2023/0178651 | A1 | 6/2023 | Zhang et al. |
| 2025/0254988 | A1* | 8/2025 | Park .................... H10D 30/031 |

* cited by examiner 210
208
214
204
206
212
202
218
220
216
AA
BB

SHIFTED-CHANNEL STACKED FETs

BACKGROUND

The present invention generally relates to semiconductor device fabrication and, more particularly, to the fabrication of stacked field effect transistors (FETs) with channels that are shifted laterally with respect to one another.

Stacked FETs can increase transistor density in semiconductor devices, particularly when the transistors are connected to one another, such as in complementary metal oxide semiconductor (CMOS) devices. However, forming electrical connections to stacked FETs can be challenging, as the presence of a top FET makes it difficult to reach the bottom FET from above, and the presence of a bottom FET makes it difficult to reach the top FET from the below.

Some stacked FET devices use vias, for example from a front side of the device to a bottom FET, that run alongside the FETs. However, positioning the vias outside the footprint of the FETs incurs additional overhead in the stacked FETs' areal density, as additional room is needed at the sides of the stacked FETs for the interconnects.

SUMMARY

A semiconductor device includes a bottom field effect transistor (FET) over a substrate, having a bottom channel and bottom source/drain structures. A bottom plug of dielectric material penetrates the substrate and that makes contact with a channel of the bottom FET. A top FET over the bottom FET has a top channel that is laterally offset with respect to the bottom channel. Electrical contacts reach to the top FET and the bottom FET.

A semiconductor device includes a bottom FET over a substrate, having a bottom channel and bottom source/drain structures. The bottom source/drain structures have a first side with a non-flat profile and a second side with a flat profile. A bottom plug of dielectric material penetrates the substrate and makes contact with a channel of the bottom FET and with the second side of the bottom source/drain structures. A top FET is over the bottom FET, having a top channel that is laterally offset with respect to the bottom channel. Electrical contacts reach to the top FET and the bottom FET and include a first contact that penetrates the bottom plug to make contact with a source/drain structure of the top FET.

A semiconductor device includes a bottom FET over a substrate, having a bottom channel and bottom source/drain structures. The bottom source/drain structures has a first side with a non-flat profile and a second side with a flat profile. A bottom plug of dielectric material penetrates the substrate and that makes contact with a channel of the bottom FET and with the second side of the bottom source/drain structures. A top FET, over the bottom FET, has a top channel that is laterally offset with respect to the bottom channel and top source/drain structures that have a first side with a non-flat profile and a second side with a flat profile. A top plug of dielectric material makes direct contact with the top channel. Electrical contacts reach to the top FET and the bottom FET, including a first contact that penetrates the bottom plug to make contact with a source/drain structure of the top FET.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figures 1, 2:
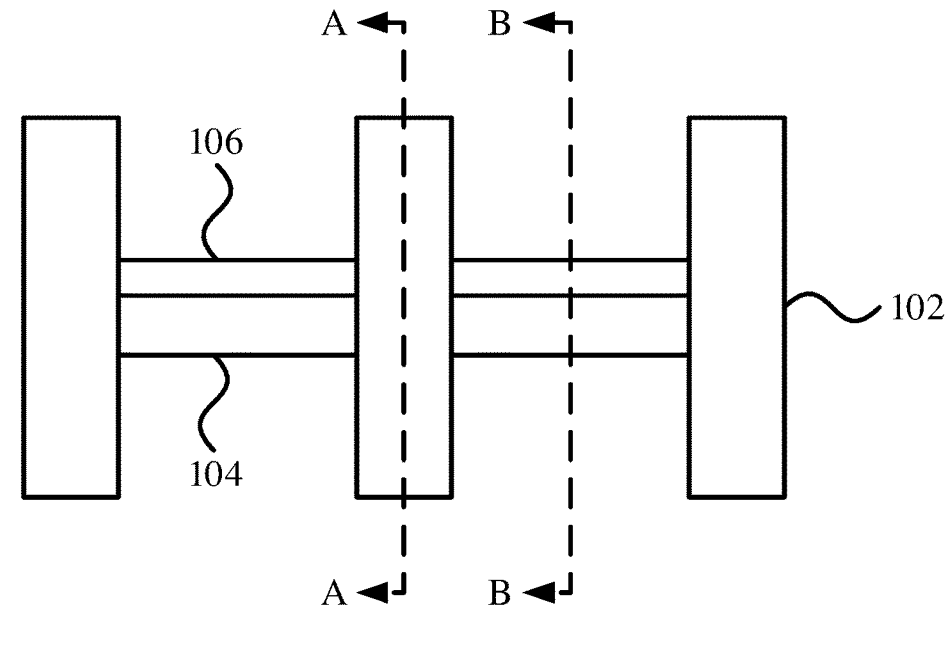
FIG. 1 is a layout view of a semiconductor device with stacked field effect transistors (FETs), in accordance with an embodiment of the present invention.
FIG. 2 is a set of cross-sectional views of a step in the fabrication of a semiconductor device with stacked FETs, showing the formation of a top FET and a bottom FET, in accordance with an embodiment of the present invention.

To help decrease the areal density of stacked field effect transistors (FETs), the channels of the FETs may be offset from one another. To form contacts between, for example, a frontside back-end-of-line (BEOL) and a bottom FET, a via may be etched vertically alongside the offset top FET without using additional area outside the area occupied by the FETs themselves.

To form such offset FETs, cuts may be formed in the channel regions of the bottom FET or of both the bottom FET and the top FET. The bottom FET may be cut using backside processing techniques, so that the cut may be formed underneath the top FET after the top FET has already been formed.

A semiconductor device includes a bottom field effect transistor (FET) over a substrate, having a bottom channel and bottom source/drain structures. A bottom plug of dielectric material penetrates the substrate and that makes contact with a channel of the bottom FET. A top FET over the bottom FET has a top channel that is laterally offset with respect to the bottom channel. Electrical contacts reach to the top FET and the bottom FET. The lateral offset of the FETs makes it possible to form the electrical contacts within the same areal footprint as the top FET and the bottom FET and thereby increase circuit density.

In some cases, the bottom source/drain structures have a first side with a non-flat profile and a second side, in contact with the bottom plug, with a flat profile. This is a result of the formation of the bottom plug and makes room for the formation of electrical contacts.

In some cases, the bottom FET further includes a bottom work function metal layer on the bottom channel and the bottom channel is in direct contact with the bottom plug. This is a result of the formation of the bottom plug, where removal of some of the bottom channel makes room for electrical contacts.

In some cases, the top FET includes a top work function metal layer on the top channel. The inclusion of the top work function metal layer makes it possible to tune electrical properties of the top FET.

In some cases, a top plug of dielectric material makes direct contact with the top channel. This minimizes the lateral distance between the top channel and an electrical contact to the bottom FET.

In some cases, the top FET includes top source/drain structures that have a first side with a non-flat profile and a second side with a flat profile. This is a result of the formation of the top plug and makes room for the formation of electrical contacts.

In some cases, the electrical contacts are uniformly vertical. This is possible because of the laterally offset FETs, so that additional area need not be consumed by forming the vias alongside the stacked FETs and then meeting them horizontally.

In some cases, a first contact of the electrical contacts penetrates the bottom plug to make contact with a source/drain structure of the top FET. By penetrating through the plug, additional area need not be consumed by forming the vias alongside the stacked FETs and then meeting them horizontally.

In some cases, there is a self-aligned substrate isolation layer between the bottom FET and the substrate. This layer prevents electrical shorting between the bottom FET and the substrate.

A semiconductor device includes a bottom FET over a substrate, having a bottom channel and bottom source/drain structures. The bottom source/drain structures have a first side with a non-flat profile and a second side with a flat profile. A bottom plug of dielectric material penetrates the substrate and makes contact with a channel of the bottom FET and with the second side of the bottom source/drain structures. A top FET is over the bottom FET, having a top channel that is laterally offset with respect to the bottom channel. Electrical contacts reach to the top FET and the bottom FET and include a first contact that penetrates the bottom plug to make contact with a source/drain structure of the top FET. The lateral offset of the FETs makes it possible to form the electrical contacts within the same areal footprint as the top FET and the bottom FET and thereby increase circuit density.

A semiconductor device includes a bottom FET over a substrate, having a bottom channel and bottom source/drain structures. The bottom source/drain structures has a first side with a non-flat profile and a second side with a flat profile. A bottom plug of dielectric material penetrates the substrate and that makes contact with a channel of the bottom FET and with the second side of the bottom source/drain structures. A top FET, over the bottom FET, has a top channel that is laterally offset with respect to the bottom channel and top source/drain structures that have a first side with a non-flat profile and a second side with a flat profile. A top plug of dielectric material makes direct contact with the top channel. Electrical contacts reach to the top FET and the bottom FET, including a first contact that penetrates the bottom plug to make contact with a source/drain structure of the top FET. The lateral offset of the FETs makes it possible to form the electrical contacts within the same areal footprint as the top FET and the bottom FET and thereby increase circuit density.

Referring now to FIG. 1, a layout view of a stacked FET semiconductor device is shown. The device includes gates 102 formed over a top channel 104 and a bottom channel 106. This top-down view illustrates that the bottom channel 106 is visible as it extends laterally beyond the edge of the top channel 104. As will be shown in greater detail below, the top channel 104 may similarly extend laterally past the edge of the bottom channel 106. Two cross-sectional planes are shown, including AA, which cuts lengthwise through the a gate 102, and BB, which is parallel to AA but which is outside of the gate 102.

Referring now to FIG. 2, a set of cross-sectional views is shown of a step in the fabrication of a stacked FET semiconductor device. These views are shown after certain structures have already been formed. In particular, bottom channels 204 and top channels 208 are formed over a semiconductor substrate 202. The bottom channels 204 have a bottom gate dielectric (not shown) and a bottom work function metal layer 206, while the top channels 208 have a top gate dielectric (not shown) and a top work function metal layer 210. The bottom channels 204 are electrically isolated from the semiconductor substrate by a self-aligned substrate isolation layer 212, while the top channels 208 are electrically isolated from the bottom channels 204 by a middle isolation layer 214.

The bottom channels 204 have bottom source/drain structures 216, while the top channels 208 have top source/drain structures 218. The channels and source/drain structures are covered by an interlayer dielectric 220. These structures form complete respective top and bottom FETs, but at this stage lack electrical connections to other structures in the semiconductor device.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

The stack of semiconductor layers may be formed on the semiconductor substrate 202 by successive epitaxial growth processes. The stack may include channel layers formed from silicon, first sacrificial layers formed from silicon germanium at a first germanium concentration, and second sacrificial layers formed from silicon germanium at a second, higher germanium concentration. The germanium concentrations may be selected to tune etch selectivity. For example, the first sacrificial layers may have a germanium concentration of about 25-30%, while the second sacrificial layers may have a germanium concentration of about 45-60%.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

A first patterning may be performed to define the bottom channels 204. The patterning may be performed using a photolithographic process. A pattern may be produced by applying a photoresist to the surface to be etched. The photoresist may be exposed to a pattern of radiation. The pattern may then be developed into the photoresist utilizing a resist developer. Once the patterning of the photoresist is completed, the sections covered by the photoresist are protected while the exposed regions are removed using a selective etching process that removes the unprotected regions. In some cases, the photoresist may be used to pattern a hardmask, which in turn is used as a mask for the selective etch.

As used herein, the term "selective" in reference to a material removal process denotes that the rate of material removal for a first material is greater than the rate of removal for at least another material of the structure to which the material removal process is being applied. The second sacrificial layers may selectively be etched away, preserving the channel layers and the first sacrificial layers. The self-aligned substrate isolation layer 212 and the middle isolation layer 214 may then be formed by a conformal deposition of dielectric material, such as silicon nitride, to fill in the gaps left behind by the second sacrificial layers. In some cases, the self-aligned substrate isolation layer 212 and the middle isolation layer 214 may be formed after gate patterning. In some cases, rather than forming the self-aligned substrate isolation layer 212 by the replacement of a sacrificial layer with dielectric, the stack of layers may be formed from a SOI substrate, with the dielectric of the SOI substrate performing the function of the self-aligned substrate isolation layer.

A second patterning may be performed using a photolithographic process to define the top channels 208, having a smaller width than the bottom channels 204. A selective anisotropic etch may be used that is timed to stop after the top channels 208 have been formed. Additional processing may be performed to form dummy gates (not shown), dummy gate spacers (not shown), inner spacers (not shown), source/drain structures (see below), dummy gate removal, and to remove the first sacrificial layers, leaving gaps between the channels using a selective isotropic etch.

An anisotropic etch preferentially removes material in a particular dimension, removing no or little material in other directions. An example of an anisotropic etch is a reactive ion etch (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface.

The bottom source/drain structures 216 may be epitaxially grown from exposed side surfaces of the bottom channels 204. The top source/drain structures 218 may be epitaxially grown from exposed side surfaces of the top channels 208. These two epitaxial growth processes may perform different respective in situ doping, according to a transistor type that is being formed. For example, the bottom source/drain structures 216 may be formed with a p-type dopant, while the top source/drain structures 218 may be formed with an n-type dopant (or vice versa). In some cases the bottom source/drain structures 216 and the top source/drain structures may have a same transistor type and a same dopant.

Due to the crystalline structure of the epitaxial material, growth may occur faster in one crystal orientation than in another, for example resulting in the generally hexagonal profile shown, where the crystal grows quickly in lateral directions until the sloped surface exhibits a different, slower-growing crystal orientation. It should be understood that a variety of different profiles are possible, with non-flat profiles being formed on the side walls of the epitaxial material.

Bottom work function metal layer 206 may be formed on and around the bottom channels 204. Top work function metal layer 210 may be formed on and around the top channels 208. The work function metals may be selected in accordance with the transistor type, as some metals are appropriate for a p-type transistor and some metals are appropriate for an n-type transistor. The work function metal layers 206/210 may be formed with respective conformal deposition processes.

The interlayer dielectric 220 may be formed by a conformal deposition of silicon dioxide or any other appropriate dielectric material. The interlayer dielectric 220 may be formed by any appropriate process such as, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 3:
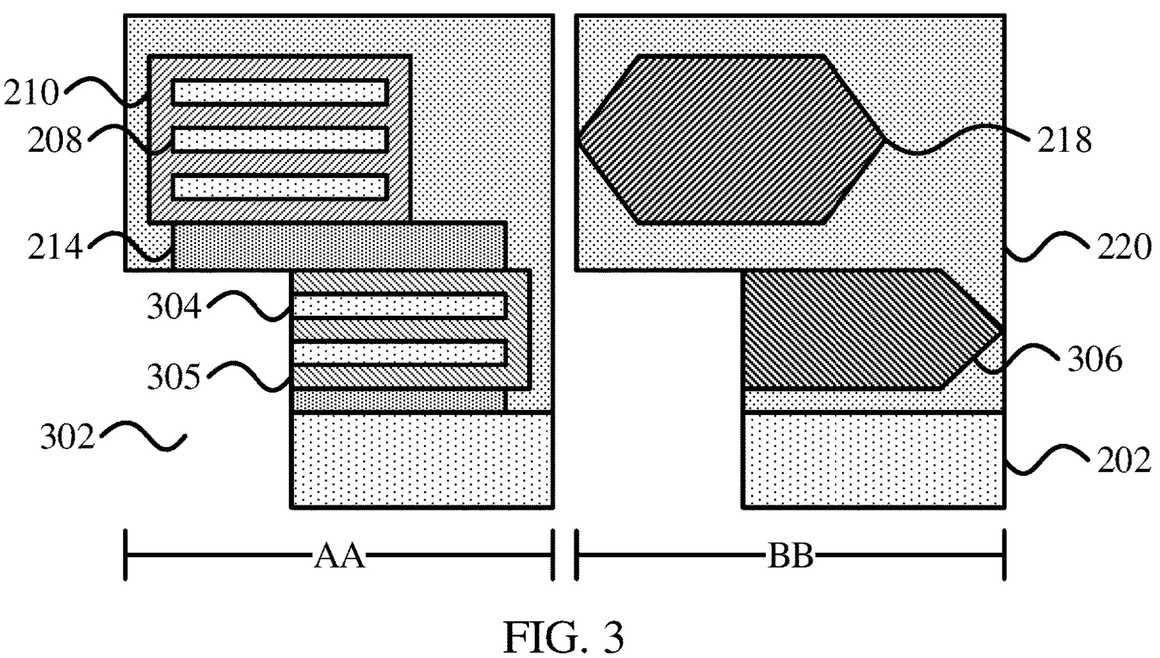
FIG. 3 is a set of cross-sectional views of a step in the fabrication of a semiconductor device with stacked FETs, showing an opening in the back side of the device that cuts through part of the bottom FET, in accordance with an embodiment of the present invention.

Referring now to FIG. 3, a set of cross-sectional views is shown of a step in the fabrication of a stacked FET semiconductor device. An opening 302 is formed from the back side of the device, penetrating through the semiconductor substrate 202, the self-aligned substrate isolation layer 212, the bottom work function metal layer 206, the bottom channels 204, and the bottom source/drain structures 216. This cuts down the bottom channels 204 to offset bottom channels 304 and the bottom source/drain structures 216 to offset bottom source/drain structures 306. The remaining portion of the bottom work function metal layer 206 forms offset bottom work function metal layer 305. The offset bottom channels 304 are offset laterally with respect to the top channels 210.

As shown, the etch that forms the opening 302 cuts off one side of the bottom source/drain structures 306. As a result, one side retains the non-flat profile shown, while the other side has a flat profile and generally vertical surface.

Figure 4:
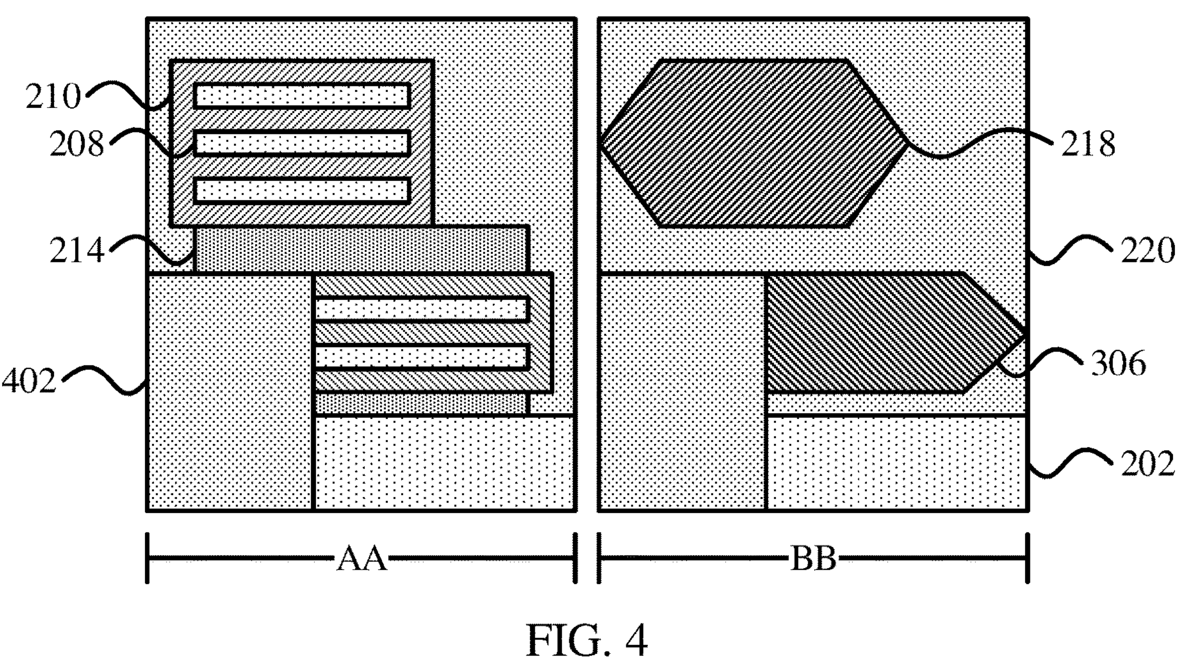
FIG. 4 is a set of cross-sectional views of a step in the fabrication of a semiconductor device with stacked FETs, showing the formation of a dielectric plug in the opening, in accordance with an embodiment of the present invention.

Referring now to FIG. 4, a set of cross-sectional views is shown of a step in the fabrication of a stacked FET semiconductor device. The opening 302 is filled with a dielectric material, such a silicon dioxide, to form a plug 402. The plug 402 may make direct contact with the offset bottom channels 304 and with the offset bottom source/drain structures 306.

Figure 5:
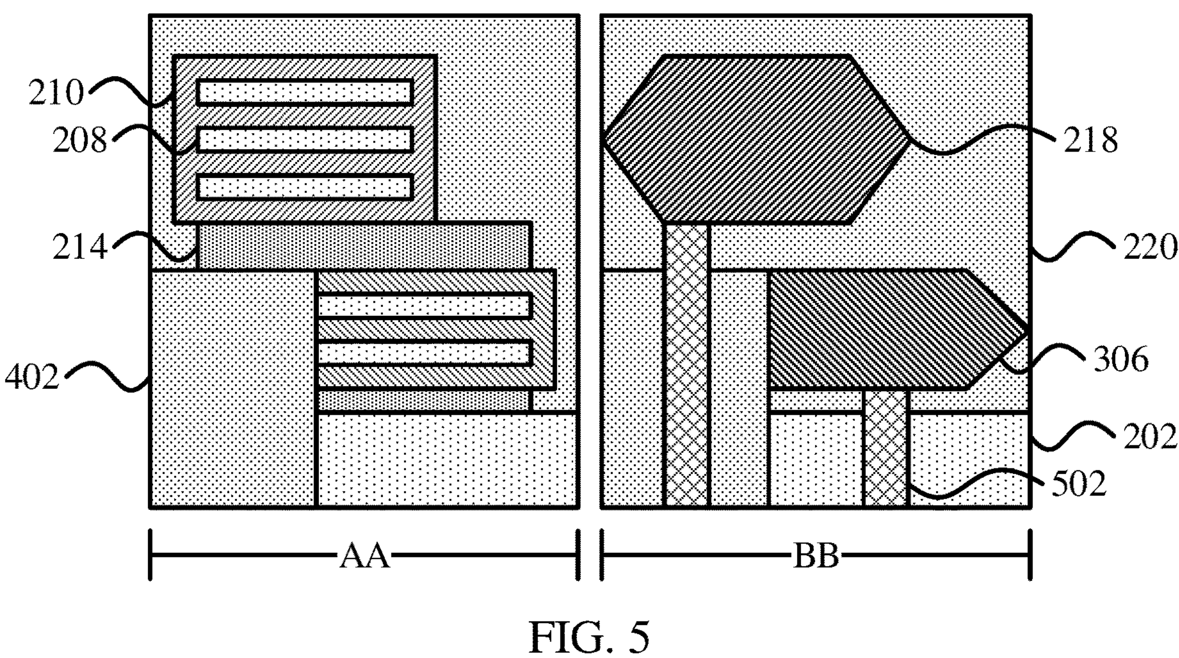
FIG. 5 is a set of cross-sectional views of a step in the fabrication of a semiconductor device with stacked FETs, showing the formation of electrical contacts to the top FET and to the bottom FET, in accordance with an embodiment of the present invention.

Referring now to FIG. 5, a set of cross-sectional views is shown of a step in the fabrication of a stacked FET semiconductor device. Backside contacts 502 are formed by patterning and anisotropically etching vias in the semiconductor substrate 202, the plug 402, and the interlayer dielectric 220. Conductive material can then be deposited in the vias to form the backside contacts 502. As can be seen in cross-section BB, backside contacts 502 can reach the top source/drain structure 218 without having to pass to the side of the top source/drain structure 218. Thus the backside contacts 502 may be uniformly vertical, without any horizontal part being needed to contact the source/drain structures.

This view shows a particular arrangement of contacts, where both the offset bottom source/drain structure 306 and the top source/drain structure 218 are contacted by backside contacts 502. In some cases, one or both of the source/drain structures may be contacted by a contact that comes from above. The top channels 208 and the offset bottom channels 304 may similarly have contacts to their respective gates from either above or below. The offset FETs can thus accommodate any combination of electrical contacts in this fashion. In some embodiments, the top work function metal layer 210 and the offset bottom work function metal layer 305 may be electrically tied to one another by a shared gate electrode, formed from any appropriate conductive material.

In some embodiments, because the top channels 208 were patterned before the top work function metal layer 210 was formed, the top work function metal layer 210 surrounds the top channels 208. In contrast, because the bottom channels 204 were patterned after the bottom work function metal layer 206 was formed, the patterning of the bottom channels 204 to form offset bottom channels 304 leaves a side of each of the offset bottom channels 304 exposed when the plug 402 is formed. Thus the offset bottom channels 304 make direct contact with the dielectric of plug 402, while top channels 208 do not make direct contact with such a dielectric structure.

Figure 6:
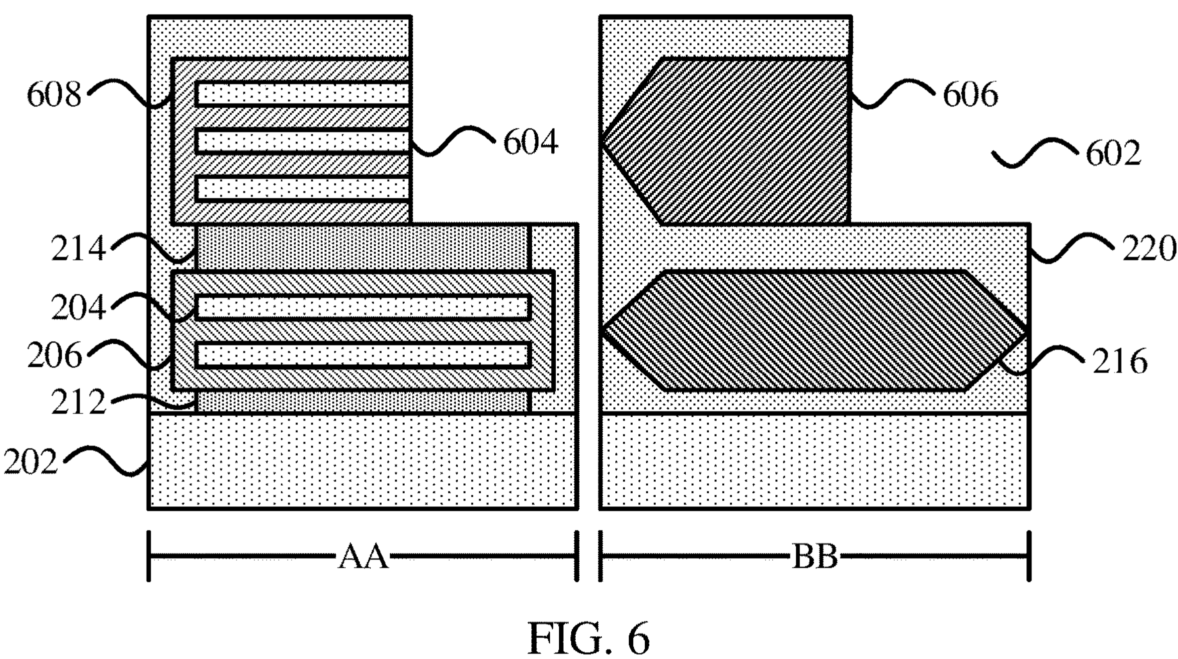
FIG. 6 is a set of cross-sectional views of a step in an alternative embodiment of the fabrication of a semiconductor device with stacked FETs, showing an opening in the front side of the device that cuts through part of the top FET, in accordance with an embodiment of the present invention.

Referring now to FIG. 6, a set of cross-sectional views is shown of a step in the fabrication of an alternative embodiment of a stacked FET semiconductor device. Similar to FIG. 2 described above, top channels and bottom channels are formed. Instead of patterning the top channels before forming the top work function metal layer, some embodiments may form a top work function metal layer around full-width layers of channel material. This stack may then be patterned and etched from above to form opening 602 that cuts through the interlayer dielectric 220, the work function metal, and the channel material, stopping on the middle isolation layer 214. The remaining portions of the top channels are offset top channels 604 and offset top work function metal layer 608. Offset top source/drain structures 606 are shown in cross-section BB.

Figure 7:
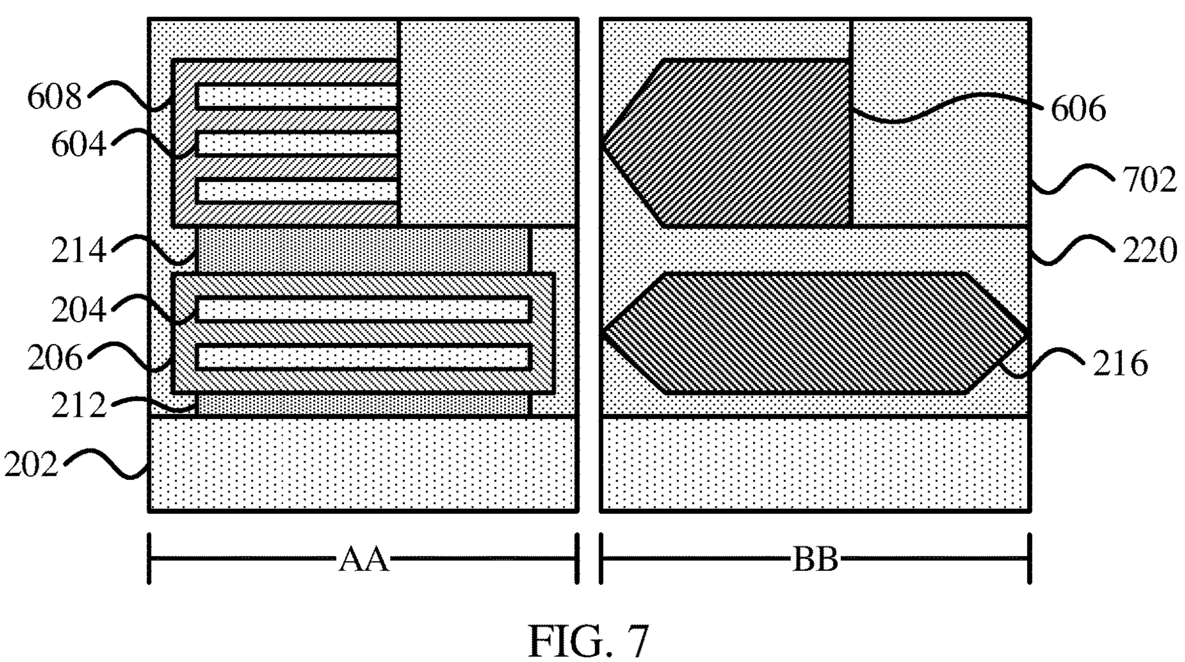
FIG. 7 is a set of cross-sectional views of a step in an alternative embodiment of the fabrication of a semiconductor device with stacked FETs, showing the formation of a dielectric plug in the opening in the front side of the device, in accordance with an embodiment of the present invention.

Referring now to FIG. 7, a set of cross-sectional views is shown of a step in the fabrication of an alternative embodiment of a stacked FET semiconductor device. The opening 602 is filled with any appropriate dielectric material, such as silicon dioxide, to form top plug 702. The top plug 702 makes direct contact with the exposed sides of the offset top channels 604 and offset top work function metal layer 608, without an intervening gate dielectric layer.

At this stage, top contacts may be formed by patterning and etching vias through the interlayer dielectric 220 from the front side of the device. The top contacts may be formed to the offset top source/drain structures 606 and/or to the bottom source/drain structures 216. However, processing may proceed to include bottom contacts as well, as described below.

Figure 8:
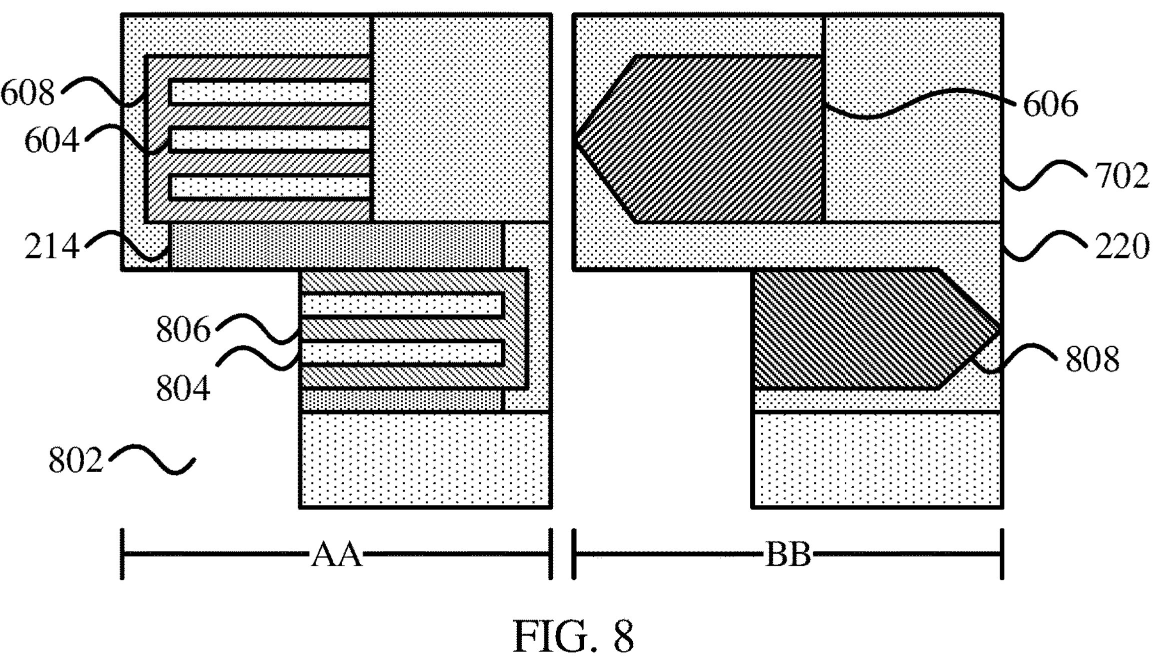
FIG. 8 is a set of cross-sectional views of a step in an alternative embodiment of the fabrication of a semiconductor device with stacked FETs, showing an opening in the back side of the device that cuts through part of the bottom FET, in accordance with an embodiment of the present invention.

Referring now to FIG. 8, a set of cross-sectional views is shown of a step in the fabrication of an alternative embodiment of a stacked FET semiconductor device. Processing from the back side of the device, opening 802 may be patterned and etched to form offset bottom channels 804 and bottom work function metal layer 806. The bottom source/drain structures 216 are similarly etched to form offset bottom source/drain structures 808.

Figure 9:
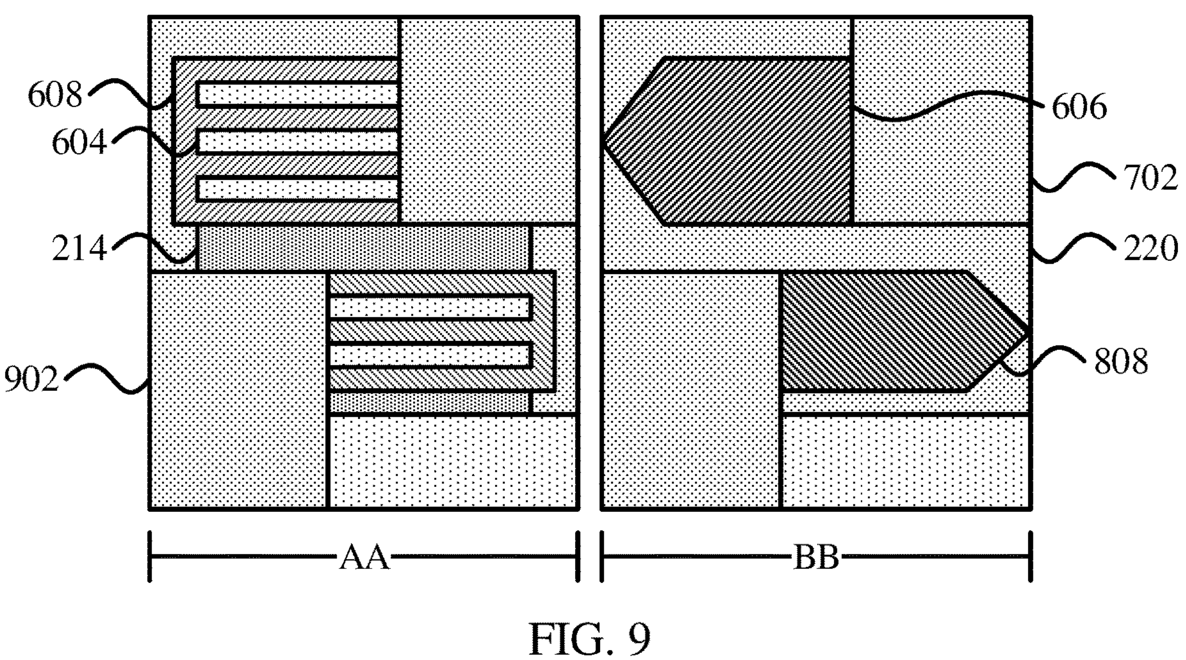
FIG. 9 is a set of cross-sectional views of a step in an alternative embodiment of the fabrication of a semiconductor device with stacked FETs, showing the formation of a dielectric plug in the opening in the back side of the device, in accordance with an embodiment of the present invention.

Referring now to FIG. 9, a set of cross-sectional views is shown of a step in the fabrication of an alternative embodiment of a stacked FET semiconductor device. The opening 802 is filled with a dielectric material, such as silicon dioxide, using any appropriate deposition process, to form bottom plug 902. At this stage, both the top FET and the bottom FET have similar structures, with the top and bottom channels directly contacting the respective top and bottom plugs.

Figure 10:
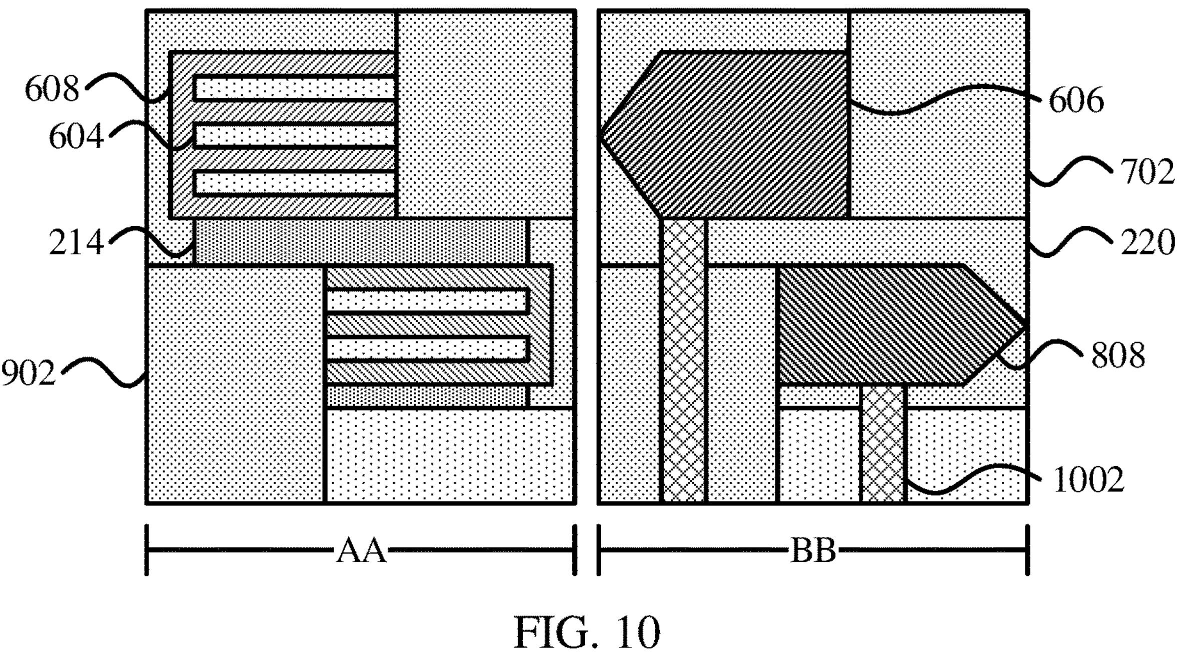
FIG. 10 is a set of cross-sectional views of a step in an alternative embodiment of the fabrication of a semiconductor device with stacked FETs, showing the formation of electrical contacts to the top FET and to the bottom FET, in accordance with an embodiment of the present invention.

Referring now to FIG. 10, a set of cross-sectional views is shown of a step in the fabrication of an alternative embodiment of a stacked FET semiconductor device. Contacts 1002 may be formed by patterning and anisotropically etching vias in the semiconductor substrate 202, the bottom plug 902, and the interlayer dielectric 220. Conductive material can then be deposited in the vias to form the contacts 1002. As can be seen in cross-section BB, contacts 1002 can reach the offset top source/drain structure 606 without having to pass to the side of the offset top source/drain structure 606.

This view shows a particular arrangement of contacts, where both the offset bottom source/drain structure 808 and the offset top source/drain structure 606 are contacted by contacts 1002. In some cases, one or both of the source/drain structures may be contacted by a contact that comes from above. The offset top channels 604 and the offset bottom channels 804 may similarly have contacts to their respective gates from either above or below. The offset FETs can thus accommodate any combination of electrical contacts in this fashion. In some embodiments, the offset top work function metal layer 608 and the offset bottom work function metal layer 806 may be electrically tied to one another by a shared gate electrode, formed from any appropriate conductive material.

In some embodiments, because the offset top channels 604 were patterned after the top work function metal layer was formed, the offset top work function metal layer 608 leaves a side surface of each of the offset top channels 604 exposed when the top plug 702 is formed. As above, the bottom channels 204 were also patterned after the bottom work function metal layer 206 was formed, so that the patterning of the bottom channels 204 to form offset bottom channels 304 leaves a side of each of the offset bottom channels 304 exposed when the bottom plug 902 is formed. Thus the offset bottom channels 304 make direct contact with the dielectric of bottom plug 902 and offset top channels 604 make direct contact with the dielectric of top plug 702.

Figure 11:
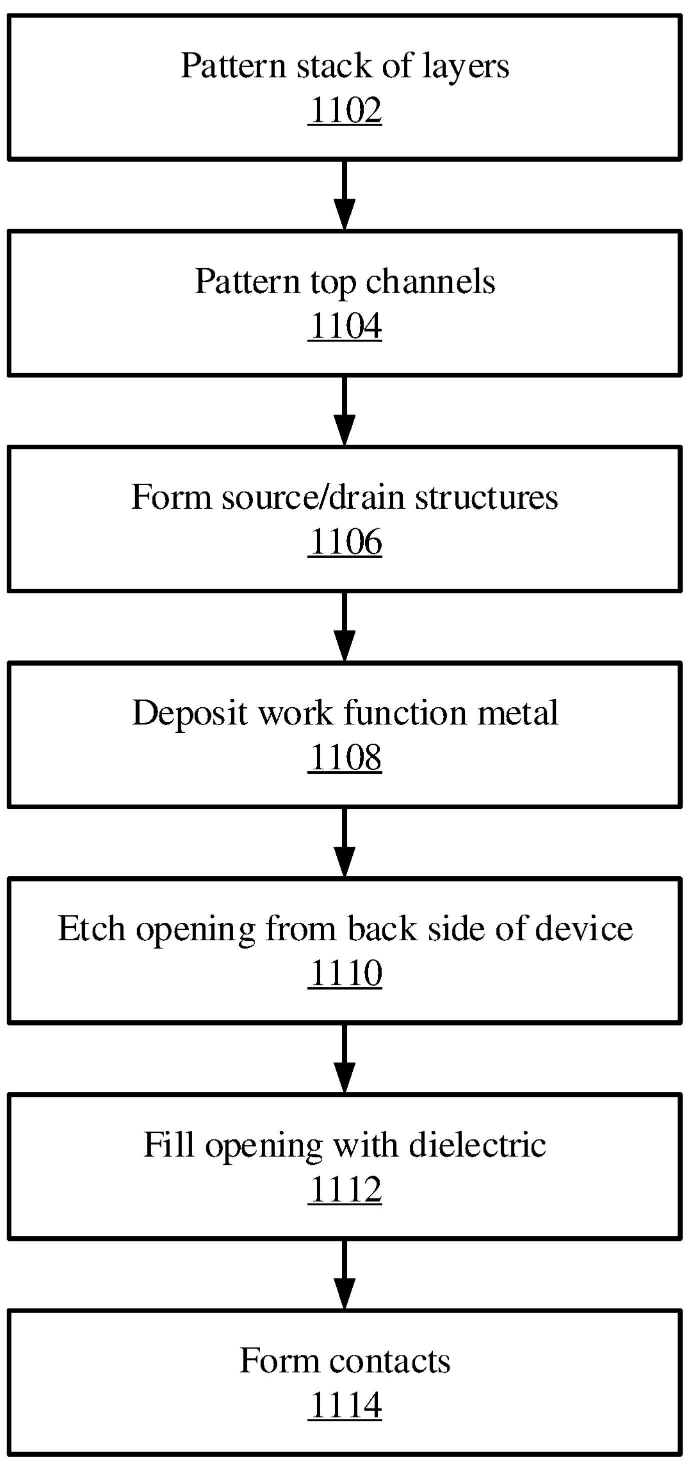
FIG. 11 is a block/flow diagram of a method of fabricating a semiconductor device with stacked FETs, in accordance with an embodiment of the present invention.

Referring now to FIG. 11, a method for fabricating a stacked FET semiconductor device is shown. It should be understood that representative steps are shown, to illustrate the present principles, and that there may be other steps involved in the fabrication that have been omitted. Block 1102 patterns a stack of semiconductor layers, including channel layers and sacrificial layers. It is specifically contemplated that the stack may include silicon channel layers and silicon germanium sacrificial layers with germanium concentrations that are selected to provide etch selectivity. Patterning the stack may include forming a mask with a photolithographic process, followed by one or more selective anisotropic etches. The size of this pattern determines the area occupied channels of the stacked FET, although the individual FETs will be offset with respect to one another.

Block 1104 then patterns the top channels 208. This patterning may include a second photolithographic process to form a second mask, followed by one or more selective anisotropic etches that stop before the bottom channels 204 are damaged. As a result, the top channels 208 have a smaller area than the bottom channels 204 at this stage, with surfaces on one side of the top channels 208 aligning with surfaces on one side of the bottom channels 204. Exemplary additional processing steps that may be performed include the recess of sacrificial layers and the formation of inner spacers. Some sacrificial layers may replaced with dielectric to form the middle isolation layer 214.

Block 1106 forms the top source/drain structures 218 and the bottom source/drain structures 216 by epitaxial growth from side surfaces of the top channels 208 and the bottom channels 204. This may be performed in one or more discrete epitaxial growth steps. For example, either the top channels 208 or bottom channels 204 may be masked during the formation of source/drain structures on the other, so that different dopants may be used and FETs with different properties may be formed. Block 1108 deposits top work function metal layer 210 around the top channels 208 and deposits bottom work function metal layer 206 around the bottom channels 204, for example after removing sacrificial semiconductor layers from between the channel layers. The deposition of the work function metal layers may also be performed in one or more discrete steps, as differing transistor types may need different work function metal compositions.

Block 1110 etches an opening 302 from the back side of the device. The etch cuts through the bottom work function metal layer 206 and the bottom channels 204 to form offset bottom work function metal layer 305 and offset bottom channels 304. Block 1112 deposits dielectric material in the opening 302 to form plug 402. Block 1114 then forms electrical contacts to the FETs, including the formation of vias through the plug 402 and through interlayer dielectric 220 and filling the vias with conductive material. The contacts backside 502 may be bottom contacts, formed from the back side of the device, or top contacts, formed from the front side of the device. In some cases, both top contacts and bottom contacts may be used.

Figure 12:
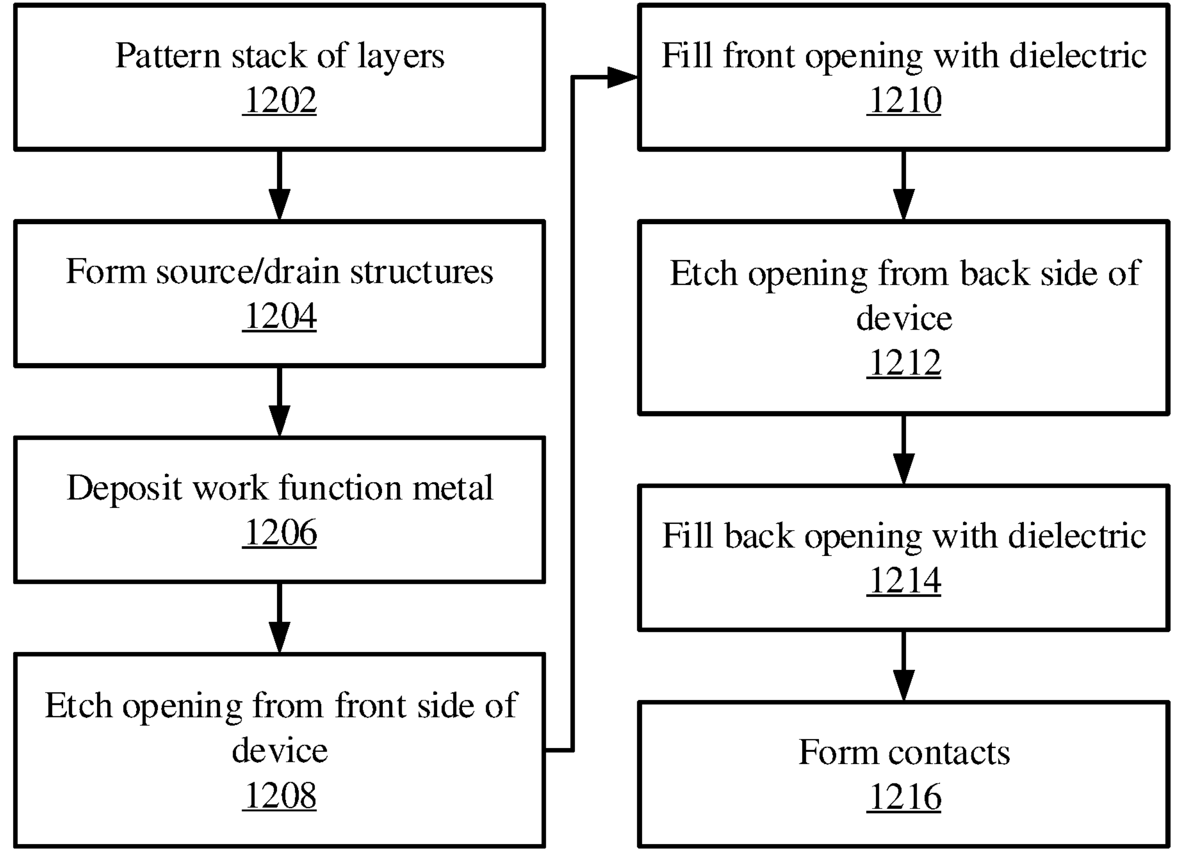
FIG. 12 is a block/flow diagram of a method of fabricating a semiconductor device with stacked FETs, in accordance with an embodiment of the present invention.

Referring now to FIG. 12, a method for fabricating a stacked FET semiconductor device is shown. It should be understood that representative steps are shown, to illustrate the present principles, and that there may be other steps involved in the fabrication that have been omitted. Block 1202 patterns a stack of semiconductor layers, including channel layers and sacrificial layers. It is specifically contemplated that the stack may include silicon channel layers and silicon germanium sacrificial layers with germanium concentrations that are selected to provide etch selectivity. Patterning the stack may include forming a mask with a photolithographic process, followed by one or more selective anisotropic etches. The size of this pattern determines the area occupied channels of the stacked FET, although the individual FETs will be offset with respect to one another.

Block 1204 forms the top source/drain structures and the bottom source/drain structures 216 by epitaxial growth from side surfaces of the top channels and the bottom channels 204. This may be performed in one or more discrete epitaxial growth steps. For example, either the top channels or bottom channels 204 may be masked during the formation of source/drain structures on the other, so that different dopants may be used and FETs with different properties may be formed. Block 1206 deposits top work function metal layer around the top channels and deposits bottom work function metal layer 206 around the bottom channels 204, for example after removing sacrificial semiconductor layers from between the channel layers. The deposition of the work function metal layers may also be performed in one or more discrete steps, as differing transistor types may need different work function metal compositions.

Block 1208 etches an opening 602 from the front side of the device. The etch cuts through the top work function metal layer and the top channels to form offset top work function metal layer 608 and offset top channels 604. Block 1210 fills the opening 602 with dielectric material to form top plug 702.

Processing continues from the back side of the device, with block 1212 etching opening 802 that cuts through the bottom work function metal layer 206 and the bottom channels 204 to form offset bottom work function metal layer 806 and offset bottom channels 804. Block 1214 deposits dielectric material in the opening 802 to form bottom plug 902. Block 1216 then forms electrical contacts 1002 to the FETs, including the formation of vias through the plug 402 and through interlayer dielectric 220 and filling the vias with conductive material. The contacts 1002 may be bottom contacts as shown in FIG. 10, formed from the back side of the device. Alternatively, block 1216 may form top contacts from the front side of the device. In some cases, both top contacts and bottom contacts may be formed.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of shifted-channel stacked FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:

a bottom field effect transistor (FET) over a substrate, the bottom FET having a bottom channel and bottom source/drain structures;

a bottom plug of dielectric material that penetrates the substrate and that makes contact with the bottom channel;

a top FET over the bottom FET, the top FET having a top channel that is laterally offset with respect to the bottom channel; and electrical contacts to the top FET and the bottom FET.

2. The semiconductor device of claim 1, wherein the bottom source/drain structures have a first side with a non-flat profile and a second side, in contact with the bottom plug, with a flat profile.

3. The semiconductor device of claim 1, wherein the bottom FET further includes a bottom work function metal layer on the bottom channel and wherein the bottom channel is in direct contact with the bottom plug.

4. The semiconductor device of claim 1, wherein the top FET further includes a top work function metal layer on the top channel.

5. The semiconductor device of claim 4, further comprising a top plug of dielectric material that makes direct contact with the top channel.

6. The semiconductor device of claim 1, wherein the top FET further includes top source/drain structures that have a first side with a non-flat profile and a second side with a flat profile.

7. The semiconductor device of claim 1, wherein the electrical contacts are uniformly vertical.

8. The semiconductor device of claim 1, wherein a first contact of the electrical contacts penetrates the bottom plug to make contact with a source/drain structure of the top FET.

9. The semiconductor device of claim 1, further comprising a self-aligned substrate isolation layer between the bottom FET and the substrate.

10. A semiconductor device, comprising:

a bottom field effect transistor (FET) over a substrate, the bottom FET having a bottom channel and bottom source/drain structures, the bottom source/drain structures having a first side with a non-flat profile and a second side with a flat profile;

a bottom plug of dielectric material that penetrates the substrate and that makes contact with the bottom channel and with the second side of the bottom source/drain structures;

a top FET over the bottom FET, the top FET having a top channel that is laterally offset with respect to the bottom channel; and electrical contacts to the top FET and the bottom FET, including a first contact that penetrates the bottom plug to make contact with a source/drain structure of the top FET.

11. The semiconductor device of claim 10, wherein the bottom FET further includes a bottom work function metal layer on the bottom channel and wherein the bottom channel is in direct contact with the bottom plug.

12. The semiconductor device of claim 10, wherein the top FET further includes a top work function metal layer on the top channel.

13. The semiconductor device of claim 12, further comprising a top plug of dielectric material that makes direct contact with the top channel.

14. The semiconductor device of claim 11, wherein the top FET further includes top source/drain structures that have a first side with a non-flat profile and a second side with a flat profile.

15. The semiconductor device of claim 11, wherein the electrical contacts are uniformly vertical.

16. The semiconductor device of claim 11, further comprising a self-aligned substrate isolation layer between the bottom FET and the substrate.

17. A semiconductor device, comprising:

a bottom field effect transistor (FET) over a substrate, the bottom FET having a bottom channel and bottom source/drain structures, the bottom source/drain structures having a first side with a non-flat profile and a second side with a flat profile;

a bottom plug of dielectric material that penetrates the substrate and that makes contact with the bottom channel and with the second side of the bottom source/drain structures;

a top FET, over the bottom FET, the top FET having a top channel that is laterally offset with respect to the bottom channel and top source/drain structures that have a first side with a non-flat profile and a second side with a flat profile;

a top plug of dielectric material that makes direct contact with the top channel; and electrical contacts to the top FET and the bottom FET, including a first contact that penetrates the bottom plug to make contact with a source/drain structure of the top FET.

18. The semiconductor device of claim 17, wherein the bottom FET further includes a bottom work function metal layer on the bottom channel and wherein the bottom channel is in direct contact with the bottom plug.

19. The semiconductor device of claim 17, wherein the top FET further includes a top work function metal layer on the top channel.

20. The semiconductor device of claim 17, wherein the electrical contacts are uniformly vertical.

* * * * *